United States Patent
Cox et al.

(10) Patent No.: US 6,189,210 B1
(45) Date of Patent: Feb. 20, 2001

(54) FIXTURE FOR CLAMPING THE LEADS OF A CIRCUIT COMPONENT FOR SOLDERING

(75) Inventors: Wilton L. Cox, Charlotte; Terry R. Richards, Harrisburg; Robert W. Wagner, Charlotte, all of NC (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/047,145

(22) Filed: Mar. 24, 1998

(51) Int. Cl.[7] .................................................. H01R 43/04
(52) U.S. Cl. .............................. 29/861; 29/741; 29/759; 29/729
(58) Field of Search .................... 29/861, 760, 729, 29/840, 741, 759, 740; 269/254 CS, 238

(56) References Cited

U.S. PATENT DOCUMENTS

| | | | |
|---|---|---|---|
| 423,054 | * 3/1890 | Heysinger | 24/67.7 |
| 635,091 | 10/1899 | Dyer . | |
| 3,122,802 | * 3/1964 | Kaufman | 24/67.7 |
| 3,452,976 | * 7/1969 | Ross | 269/91 |
| 3,828,402 | * 8/1974 | Gorman | 24/81 PH |
| 3,938,797 | 2/1976 | Frederick . | |
| 4,202,092 | * 5/1980 | Shibasaki et al. | 29/741 |
| 4,316,072 | * 2/1982 | Arnoldt | 219/86.24 |
| 4,524,860 | * 6/1985 | Misawa et al. | 198/740 |
| 4,638,938 | 1/1987 | Yarne et al. . | |
| 4,752,025 | * 6/1988 | Stach et al. | 228/9 |
| 4,825,530 | 5/1989 | Komuro . | |
| 5,318,212 | 6/1994 | Becker et al. . | |
| 5,598,775 | 2/1997 | Vongfuangfoo et al. . | |
| 5,647,528 | 7/1997 | Ball et al. . | |

* cited by examiner

*Primary Examiner*—Lee Young
*Assistant Examiner*—Minh Trinh
(74) *Attorney, Agent, or Firm*—Ratner & Prestia; Lawrence R. Fraley, Esq.

(57) ABSTRACT

A fixture for aligning the leads of SMT components with the corresponding pads of the printed circuit board, which is to receive such components, before soldering the leads to the pads. The fixture includes clamps for applying forces directly to the leads of the SMT components, alone or in conjunction with the clamping forces which are traditionally applied to the body of the component, the applied forces sufficient to seat the leads on the corresponding pads. In a preferred embodiment, the forces are applied by providing the fixture with a series of rocker-type clamps, each having an edge for engaging the several leads associated with a particular SMT component to be joined to the printed circuit board. The clamp is preferably constructed of a non-wettable material so that the edge of the clamp will not be wet by the molten solder during the soldering procedure, and the edge is preferably thin so that the clamping surface in contact with a particular lead is minimized. Openings are provided in the clamp, above each of the leads of the SMT component, to allow radiant and convective heat transfer to and from each of the solder joints. Such clamping allows SMT components to be wave soldered or soldered in a reflow oven.

27 Claims, 3 Drawing Sheets

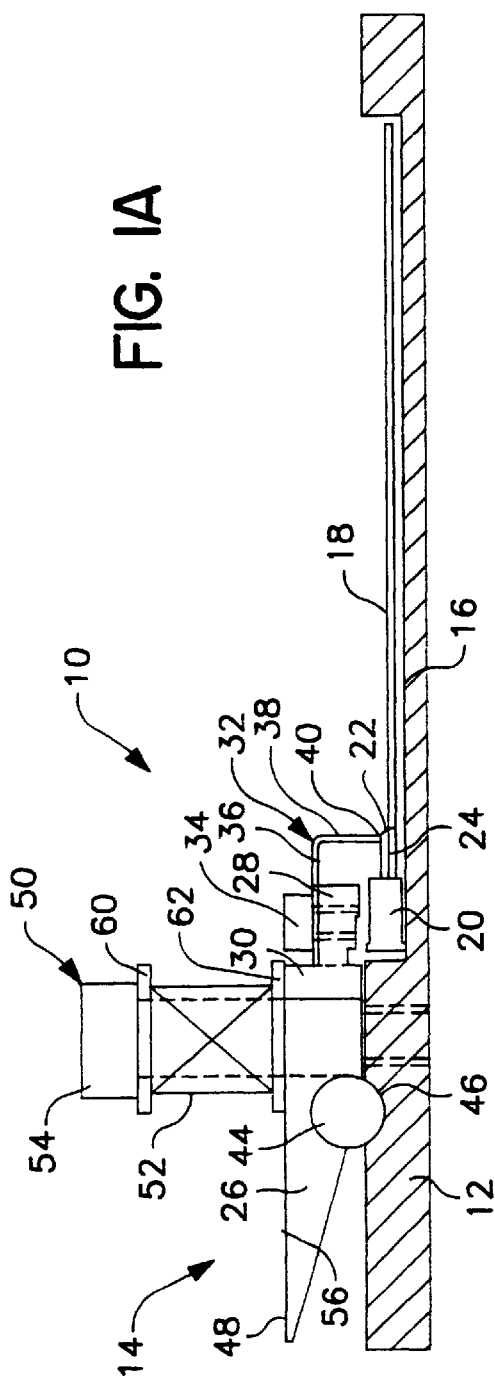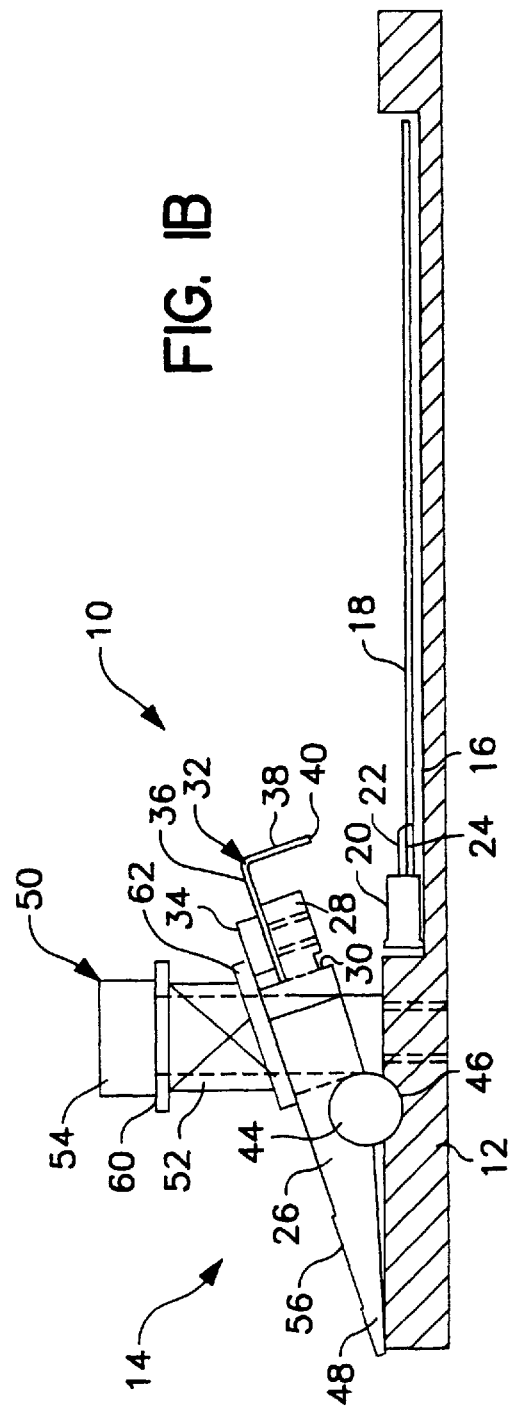

FIXTURE FOR CLAMPING THE LEADS OF A CIRCUIT COMPONENT FOR SOLDERING

TECHNICAL FIELD

The present invention is generally directed to the manufacture of printed circuit boards and, in particular, to a fixture for facilitating the manufacture of printed circuit boards bearing surface-mounted (i.e., SMT) components.

BACKGROUND OF THE INVENTION

One common technique used in the manufacture of printed circuits involves the application of components to one side, or surface, of the printed circuit board, followed by connection of the leads associated with the applied components to a corresponding series of pads formed on the surface of the printed circuit board. To ensure a proper result, care must be taken to correctly locate such SMT components on the printed circuit board so that the leads of each component are correctly aligned with their corresponding pads. Steps are then taken to appropriately connect the leads to the corresponding pads, using soldering techniques which are themselves known.

The improvements of the present invention are primarily directed to a particular step of the manufacturing process which is used to assemble a printed circuit board bearing SMT components, the step of soldering the plural leads of the components to the pads on the printed circuit board. In practice, one of the difficulties encountered in applying SMT components to a printed circuit board has been to ensure that all of the leads associated with a particular component are approximately co-planar with the corresponding pads on the printed circuit board. This co-planarity is important in preparing the leads for soldered connection to the corresponding pads. Moreover, it has been found that the difficulties encountered in aligning the leads to their corresponding pads are magnified by situations in which components (1) extend over the edge of the printed circuit board, (2) are placed on solid solder rather than on solder paste, or (3) have locating projections.

A variety of fixtures have been used in the industry to manufacture (solder) printed circuit (i.e., electronic card) assemblies. When used in conjunction with a wave solder process, such fixtures often include weights or clamps to press down on the body of the SMT component while the soldering takes place. Such weights and clamps are not typically used on the fixtures, however, when reflow soldering is employed. In addition, the fixtures have not been found to be entirely satisfactory for ensuring proper alignment of the plural leads of an SMT component with each of the corresponding pads which are to receive the soldered leads. This problem is exacerbated as the number of leads associated with a given SMT component increases, responsive to advances in technology, requiring accommodation of a greater number of leads (and a correspond number of pads) in a limited amount of space.

Therefore, a primary object of the present invention is to provide an improved fixture for use in soldering the leads of SMT components to the corresponding pads of a printed circuit board. Another object of the present invention is to provide an alignment fixture for ensuring that all of the leads of an SMT component are approximately co-planar with the corresponding pads of the printed circuit board after their soldered connection.

SUMMARY OF THE INVENTION

These and other objects which will become apparent are achieved in accordance with the present invention by providing a fixture for aligning the leads of SMT components with the corresponding pads of the printed circuit board which is to receive such components. The fixture includes appropriate clamps for applying forces directly to the leads of the SMT components, alone or in conjunction with the clamping forces which are traditionally applied to the body of the component. In this way, forces are applied to the leads sufficient to seat each of the leads on its corresponding pad, thereby ensuring that the leads are approximately co-planar before soldering.

Preferably, the advantages of the present invention are accomplished by providing the fixture with an appropriate series of rocker-type clamps, each having an edge for engaging the several leads associated with a particular SMT component to be joined to the printed circuit board. The clamp is preferably constructed of a non-wettable material, such as titanium, so that the edge of the clamp will not be wet by the molten solder during the soldering procedure. The edge is preferably thin so that the clamping surface in contact with a particular lead is minimized. Openings are advantageously provided in the clamp, above each of the leads of the SMT component, to allow radiant and convective heat transfer to each of the solder joints. Such a clamp further allows SMT components to be soldered in a reflow oven, which would otherwise have required either a manual process or special equipment.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, the dimensions of the various features are arbitrarily expanded or reduced for clarity. Included in the drawing are the following figures:

FIG. 1A is a partially sectioned, side elevational view of a clamp assembly produced in accordance with the present invention;

FIG. 1B is a partially sectioned, side elevational view of the clamp assembly of FIG. 1A in an open position;

DETAILED DESCRIPTION OF PREFERRED EMBODIMENTS

Figure 2A:
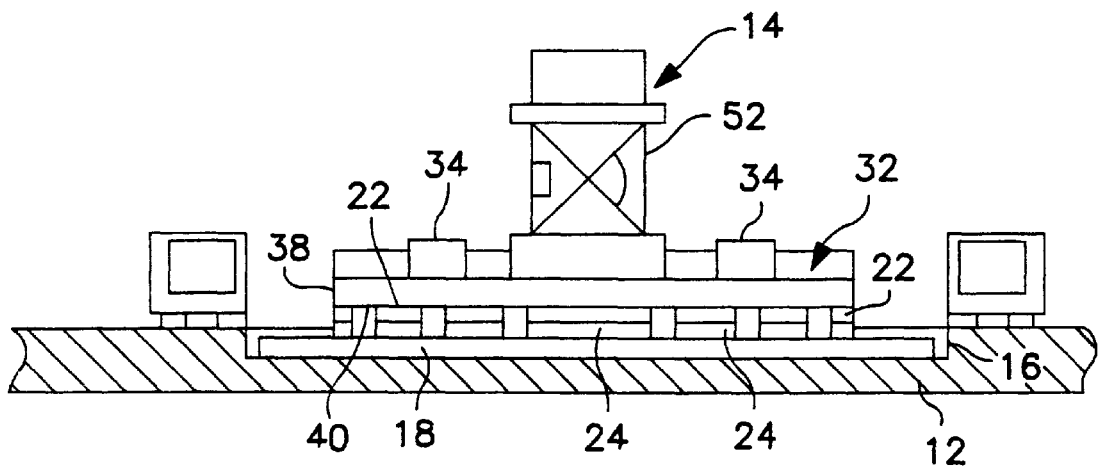
FIG. 2A is a partially sectioned, end elevational view of the clamp assembly of FIG. 1A.

FIGS. 1A and 1B generally illustrate a preferred fixture 10 produced in accordance with present invention. The fixture 10 generally includes a base 12, which serves as the work board holder, and a clamp assembly 14 associated with the base 12.

The base 12 includes a recessed portion 16 for receiving the various elements which are to be joined together as part of a conventional soldering process. Generally speaking, these elements will include a printed circuit board 18 and a plurality of SMT components 20. Each of the SMT components 20 will include a plurality of leads 22 for electrical connection to a corresponding series of pads 24 associated with the printed circuit board 18, in otherwise conventional fashion.

It will be understood that the configuration shown for the printed circuit board 18 and the SMT components 20 will vary with the particular assembly being formed, and that the structural elements shown in the drawing have been selected only for purposes of illustrating the improvements of the present invention. The configuration of the recessed portion 16 associated with the base 12 will correspondingly vary, responsive to the configuration of the printed circuit board 18 and the SMT components 20 received by the printed circuit board 18. In any event, the fixture 10 of the present invention will be equally suited to use with these various configurations. It would further be possible to use the fixture 10 to manufacture printed circuit constructions involving components other than SMT components 20, in cases requiring a positive alignment of the leads associated with a given electronic component relative to the features of the printed circuit board (card) which is to receive such a component.

The clamp assembly 14 includes an arm 26 having a connector 28 projecting from a first end 30. A clamp 32 projects from the connector 28, and is fixed to the connector 28 using a conventional fastener, such as the attachment screw 34 shown. The clamp 32 includes a body 36 for attachment to the connector 28, and a flange 38 projecting downwardly from the body 36. The flange 38 is positioned to present an edge 40 for directly engaging the several leads 22 of the SMT component 20, to urge the leads 22 into engagement with the pads 24 on the printed circuit board 18. Given that the leads 22 have a length, the clamp 32 has a thickness which is less than the length of the leads 22 so that substantial portions of the leads 22 remain exposed once the clamp 32 engages the leads 22.

As illustrated, the flange 38 is preferably formed perpendicular to the leads 22, and preferably engages terminating (distal) portions of the leads 22, as shown. The flange 38 is preferably relatively thin to present a narrow edge 40 against the leads 22. A thin profile is preferred to minimize interaction between the flange 38 and the leads 22 during the soldering process which will subsequently take place. The clamp 32 is further preferably constructed of a non-wettable material, such as titanium, or possibly stainless steel or a phenolic resin, so that the edge 40 of the clamp 32 will not be wet by the molten solder during the soldering procedure.

Figure 2B:
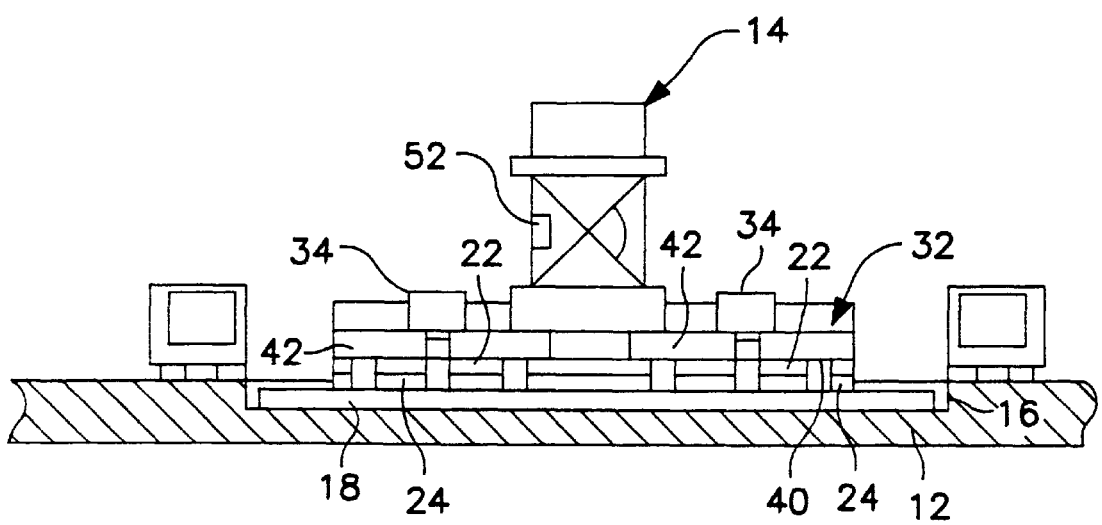
FIG. 2B is a partially sectioned, end elevational view of an alternative embodiment clamp assembly produced in accordance with the present invention.

Referring to FIG. 2A, the flange 38 is preferably formed as a single, unitary, monolithic structure for collectively engaging the several leads 22 of the component 20, which contributes to the structural integrity of the clamping structure. As shown in FIG. 2B, however, the flange 38 can be replaced with a plurality of fingers 42 for separately engaging the several leads 22 (or groupings of the leads 22) associated with the SMT component 20, if desired. This latter arrangement is useful in applications where it is desirable to separately engage the leads 22 so that the leads 22 can be individually urged into engagement with their respective pads 24. In either case, a substantially co-planar relationship is established between the several leads 22 of the SMT component 20 and the corresponding pads 24 to which the leads 22 will be attached, before subjecting the assembly to the soldering process.

The arm 26 of the clamp assembly 14 further includes a rocker 44 for engaging a recess 46 formed in the base 12 (see FIGS. 1A and 1B). Rocker 44 and recess 46 permit the arm 26 to be rotated responsive to pressure applied to the opposing end 48 of the arm 26 (e.g., responsive to finger pressure). The arm 26 is secured to the base 12 by a bolt 50 which projects, through the arm 26, to the base 12. A spring 52 is positioned between the head 54 of the bolt 50 and top edge 56 of the arm 26, to urge the arm 26 and the clamp 32 downwardly and into engagement with the base 12 and the leads 22 of the SMT component 20 then positioned within the recessed portion 16 of the base 12 (over the pads 24 of the printed circuit board 18). Washers 60 and 62 are disposed around the bolt 50. First washer 60 is positioned under the head 54 of the bolt 50; second washer 62 is positioned over the top edge 56 of the arm 26. Washers 60 and 62 help to prevent binding as the arm 26 rotates.

Figure 3:
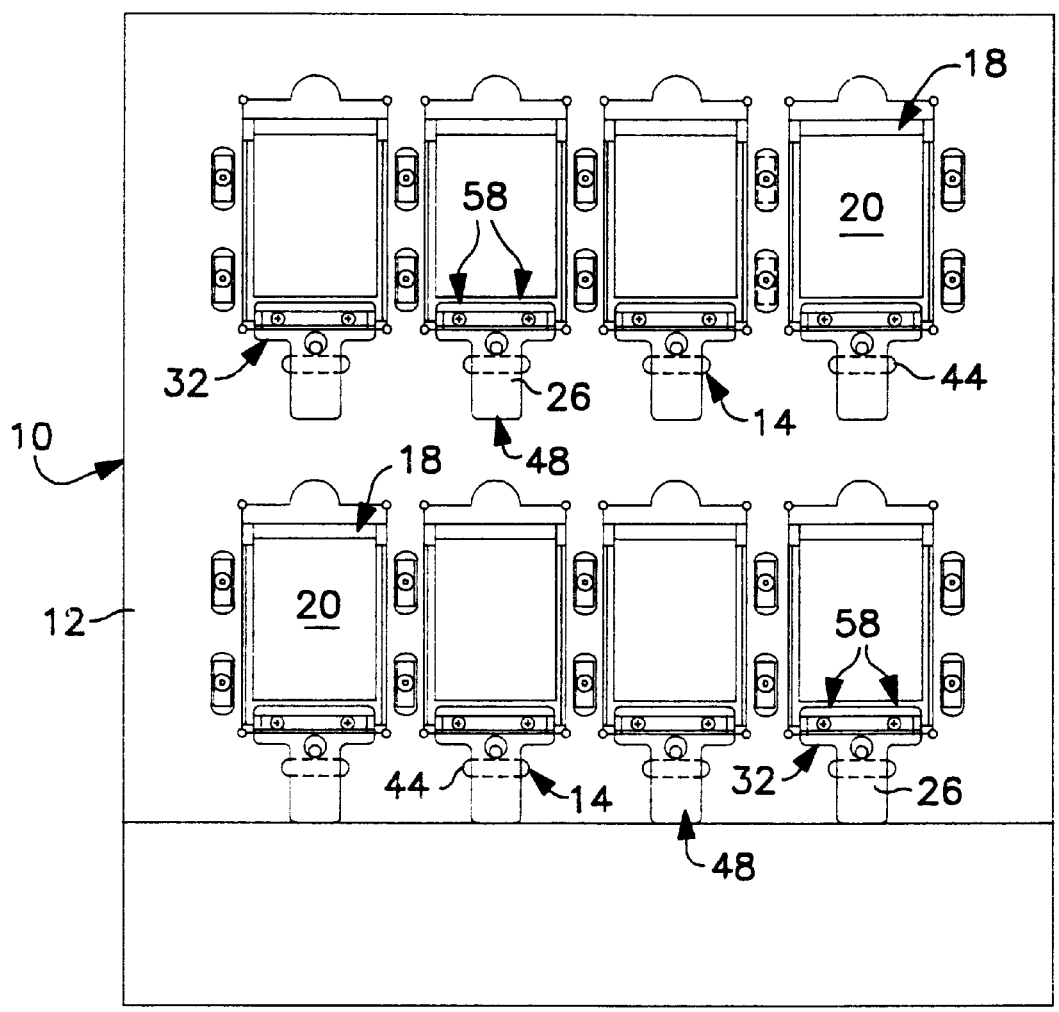
FIG. 3 is a top plan view of a fixture incorporating a plurality of clamp assemblies produced in accordance with the present invention, shown in conjunction with a plurality of SMT components which are to be joined to a printed circuit board.
Figure 4:
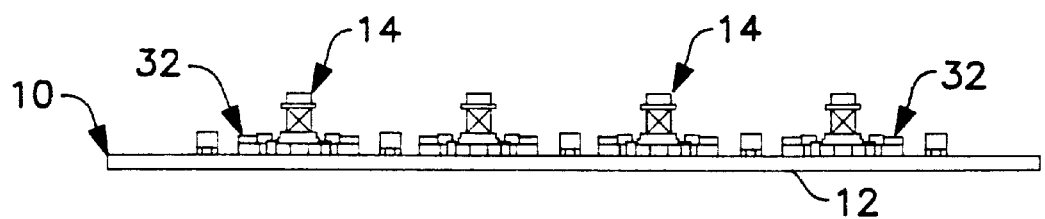
FIG. 4 is an end elevational view of the fixture shown in FIG. 3.

FIGS. 3 and 4 show an illustrative use of the fixture 10 of the present invention. In this illustration, the fixture 10 has been implemented to attach twenty-two-pin connector frame assemblies to a PC card which meets the standards established by PCMCIA. In use, a printed circuit board 18 (or boards), which is to receive the desired SMT component 20 or components, is positioned within the recessed portion 16 formed in the base 12. The SMT component 20 is then aligned (positioned) relative to the printed circuit board 18 and the corresponding pads 24. In conjunction with this alignment of the several SMT components 20, pressure is applied to the opposing end 48 of the arm 26 of the clamp assembly 14 associated with a particular SMT component 20, allowing the SMT component 20 to pass between the flange 38 of the clamp 32 and the exposed surface of the printed circuit board 18.

Following the alignment of each SMT component 20 relative to the printed circuit board 18, the opposing end 48 of the arm 26 is released, maintaining the SMT component 20 in its desired position. Such clamping also aligns and clamps the leads 22 of the SMT component 20 to the pads 24 on the printed circuit board 18. All necessary alignment is accomplished simply, and automatically, as a result of the structure of the clamp assembly 14 of the present invention. The resulting assembly is then ready to undergo an appropriate soldering procedure (e.g., wave soldering or reflow soldering). The clamp 32 is provided with appropriate apertures 58 to promote heat transfer relative to the solder connections to be made: heat can pass through the clamp 32 to and from the leads 22 and the pads 24 positioned beneath the clamp 32.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A fixture in combination with a printed circuit board and a circuit component, for use in soldering the circuit component to the printed circuit board, wherein the circuit component includes a plurality of leads for connection to corresponding pads provided on the printed circuit board, and wherein the fixture comprises:

a base having a surface which receives the printed circuit board so that the pads are exposed; and a clamp assembly fixed to the base and including an arm which is pivotally associated with the base and a clamp which is attached to and which extends from the arm, wherein the clamp is in direct engagement with the leads of the circuit component and wherein the leads of the circuit component are received between the clamp and the pads on the printed circuit board so that the leads are in direct engagement with the pads on the printed circuit board.

2. The fixture of claim 1 wherein the base further includes a recessed portion which receives the printed circuit board so that the printed circuit board is aligned relative to the base.

3. The fixture of claim 1 wherein the clamp engages terminating portions of the leads, distal from the component.

4. The fixture of claim 1 wherein the clamp is oriented substantially perpendicular to the leads.

5. The fixture of claim 1 wherein the leads have a length, and wherein the clamp has a thickness which is less than the length of the leads so that substantial portions of the leads remain exposed once the clamp engages the leads.

6. The fixture of claim 1 wherein the clamp has a single edge which engages the plurality of leads.

7. The fixture of claim 1 wherein the clamp includes a plurality of fingers which separately engage the leads of the circuit component.

8. The fixture of claim 1 wherein the clamp includes an aperture formed in the clamp which passes heat through the clamp to and from the leads and the pads positioned beneath the clamp.

9. The fixture of claim 1 wherein the clamp is formed of a non-wettable material.

10. The fixture of claim 1 wherein the arm includes a first end which receives the clamp and a second end opposite to the first end for receiving forces for pivoting the arm so that the clamp is moved into and out of engagement with the base.

11. The fixture of claim 10 which further includes a spring positioned to bias the clamp into engagement with the base.

12. The fixture of claim 1 which further includes a plurality of clamp assemblies associated with the printed circuit board.

13. The fixture of claim 1 wherein the circuit component is an SMT component.

14. A fixture in combination with a printed circuit board and a circuit component, for use in soldering the circuit component to the printed circuit board, wherein the circuit component includes a plurality of leads having a length for connection to corresponding pads provided on the printed circuit board, and wherein the fixture comprises:

a base having a surface with a recessed portion which receives the printed circuit board so that the printed circuit board is aligned relative to the base and the pads are exposed; and a clamp assembly fixed to the base and including:

(a) an arm which is pivotally associated with the base, and (b) a clamp formed of a non-wettable material attached to and extended from the arm, wherein the clamp is in direct engagement with terminating portions of the leads distal from the circuit component, wherein the leads of the circuit component are received between the clamp and the pads on the printed circuit board so that the leads are in direct engagement with the pads on the printed circuit board, wherein the clamp has a thickness which is less than the length of the leads so that substantial portions of the leads remain exposed when the clamp engages the leads, and wherein the clamp further includes an aperture which passes heat through the clamp to and from the leads and the pads positioned beneath the clamp.

15. The fixture of claim 14 wherein the clamp is oriented substantially perpendicular to the leads.

16. The fixture of claim 14 wherein the clamp has a single edge which engages the plurality of leads.

17. The fixture of claim 14 wherein the clamp includes a plurality of fingers which separately engage the leads of the circuit component.

18. The fixture of claim 14 wherein the arm includes a first end which receives the clamp and a second end opposite to the first end for receiving forces for pivoting the arm so that the clamp is moved into and out of engagement with the base.

19. The fixture of claim 18 which further includes a spring positioned to bias the clamp into engagement with the base.

20. The fixture of claim 14 which further includes a plurality of clamp assemblies associated with the printed circuit board.

21. The fixture of claim 14 wherein the circuit component is an SMT component.

22. The fixture of claim 1 further comprising means coupled with the fixture and in alignment with the clamp for transferring heat to the leads and the pads of the printed circuit board engaged by the clamp.

23. The fixture of claim 22 wherein the clamp further includes means for applying force to the leads and the pads of the printed circuit board, in combination with the heat transferring means.

24. The fixture of claim 14 further comprising means coupled with the fixture and in alignment with the clamp for transferring heat to the leads and the pads of the printed circuit board engaged by the clamp.

25. The fixture of claim 24 wherein the clamp further includes means for applying force to the leads and the pads of the printed circuit board, in combination with the heat transferring means.

26. The fixture of claim 23 in further combination with solder connecting the leads of the circuit component and the pads on the printed circuit board while the leads of the circuit component are engaged with the pads on the printed circuit board by the clamp, wherein the solder receives heat from the heat transferring means.

27. The fixture of claim 25 in further combination with solder connecting the leads of the circuit component and the pads on the printed circuit board while the leads of the circuit component are engaged with the pads on the printed circuit board by the clamp, wherein the solder receives heat from the heat transferring means.

* * * * *